United States Patent [19]

Smith

[11] 4,182,569
[45] Jan. 8, 1980

[54] LITHOGRAPHIC DUAL LIGHT SOURCE APPARATUS

[75] Inventor: Terry L. Smith, Harrisburg, Pa.
[73] Assignee: Dual Light Inc., Harrisburg, Pa.
[21] Appl. No.: 799,332
[22] Filed: May 23, 1977
[51] Int. Cl.$^2$ .............................................. G03B 27/10
[52] U.S. Cl. ...................................... 355/84; 355/113; 362/11
[58] Field of Search ........................... 355/84, 113, 70; 362/11, 231, 233, 250, 285, 289, 418

[56] References Cited

U.S. PATENT DOCUMENTS

| | | | |
|---|---|---|---|
| 2,153,186 | 4/1939 | Henderson | 355/70 |
| 2,919,635 | 1/1960 | Levine et al. | 355/84 |
| 2,988,979 | 6/1961 | Sigler | 355/84 |
| 3,007,390 | 11/1961 | Forester et al. | 355/84 |
| 3,723,001 | 3/1973 | Zeunen et al. | 355/84 |

Primary Examiner—Richard A. Wintercorn
Attorney, Agent, or Firm—Fisher, Christen & Sabol

[57] ABSTRACT

An apparatus is disclosed for alternatively positioning a quartz or pinpoint light above a vacuum printing frame in a lithographic process. Either a quartz or a pinpoint light is required to produce fine line contacts, duplicates and reverses which are subsequently arranged in the desired orientation and transferred onto a printing plate for offset printing. The apparatus is located over a vacuum printing frame, or similar device, and has both the quartz light and pinpoint light attached to a movable housing. The housing is movable along two rails so as to accurately position either of the lights in its proper position over the printing frame. Movement of the housing is initiated by the operator and ceases when the housing contacts a limit switch.

15 Claims, 5 Drawing Figures

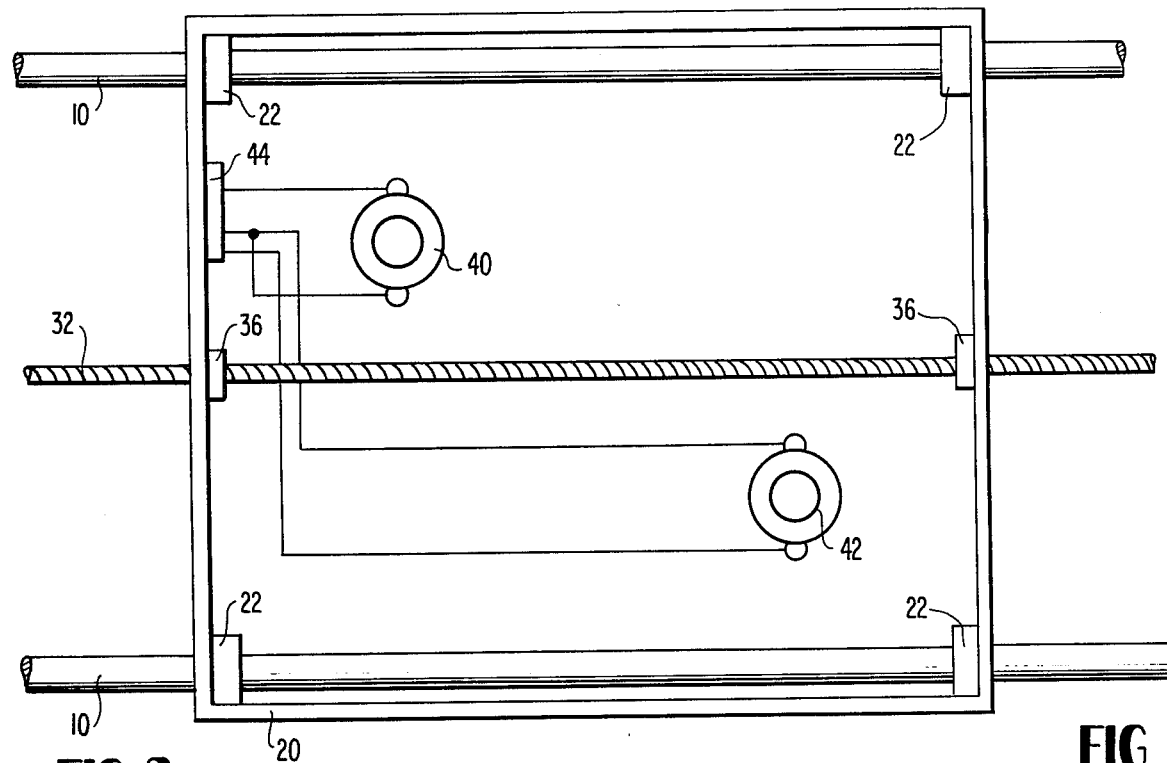
FIG 2
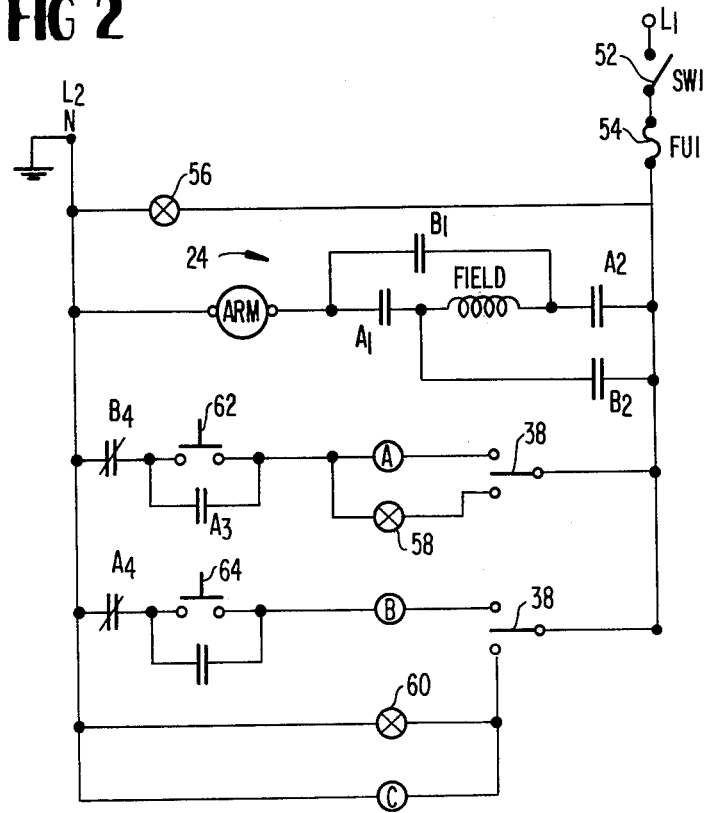
FIG 3
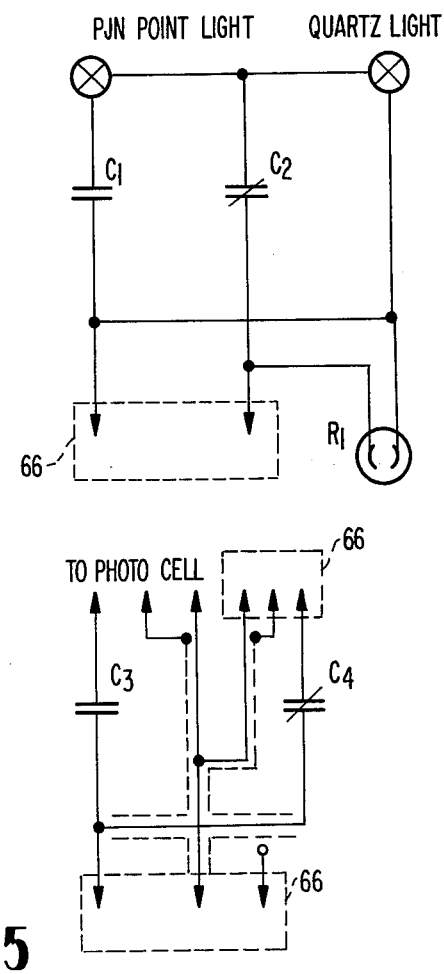
FIG 4
FIG 5

LITHOGRAPHIC DUAL LIGHT SOURCE APPARATUS

FIELD OF THE INVENTION

The invention relates to film processing for an offset printing process, more particularly an apparatus for positioning lights in the film processing operation.

BRIEF DESCRIPTION OF THE PRIOR ART

In known lithographic processes, such as offset printing, a printing plate is made by processing exposed film into fine line contacts, duplicates and/or reverses, arranging them in the desired orientation and transferring to a printing plate. The exposed film processing takes place under darkroom conditions and typically involves placing raw film and the exposed film into a standard vacuum printing frame and exposing the films with either a quartz or pinpoint light. The quartz light provides bright, evenly distributed light while the pinpoint light provides a narrow beam, as the name implies. The light used depends upon the type of film processing. The quartz light is used for flat duplicates, contact composite duplicates, and may be used in conjunction with a gam control to alter the structure of dot size and density for color correcting negatives. Pinpoint light is for finelines (dot to dot reproduction of a negative), positives, and to give a slow range of exposure so as to vary the scale of change that takes place during the exposure.

The process requires the use of one light or the other, never both lights at the same time. In most prior art installations, the pinpoint light is immovably attached to the wall or ceiling directly above the vacuum frame while the quartz light is attached so as to be movable into and out of position below the pinpoint light, but above the vacuum frame. Since both lights must occupy the same position above the vacuum frame, it has been necessary to have one vertically displaced above the other. This has necessitated a constant changing of the gam control or light timer depending on which light is used, since they are different distances from the vacuum frame. If the operator forgets to change the gam control or timer, the shot will be ruined and have to be re-shot. Also, it is very time consuming to manually move the quartz light into or out of position, thereby lengthening the time necessary to complete a shot.

In many installations, there is no way to accurately position the quartz light in the same position repeatedly, especially under darkroom conditions, thereby rendering accurate reproductions of previous shots impossible. Additionally, the separate lights and controls require a large amount of electrical wiring to interconnect them, resulting in electrical hazards and additional expense.

To eliminate the inherent inaccuracy and time consumption of the manually movable lights, some have resorted to having completely separate darkrooms, one having the pinpoint light and one having the quartz light. At best this is a dubious solution to the problem and results in unnecessary usage of floor space and increased capital expense.

U.S. Pat. No. 3,536,403 to Strickholm discloses a facsimile recorder for recording a screened copy on photographic film wherein a single light source in a housing is moved back and forth across a rotating drum to produce a half tone cut. The housing is moved by its connection to a rotatable lead screw driven by an electric motor.

U.S. Pat. No. 2,487,066 to Moen Jr. discloses a variable speed, movable light for a photographic copying apparatus. The light, a single fluorescent bulb, is moved back and forth along the articles to be copied by a pair of endless chains, attached to each end of the tube, driven by sprockets connected to a motor.

Both Strickholm and Moen Jr. relate to copying apparatus wherein the single light remains on during its traversal, and not to apparatus for positioning a light above a film to be duplicated as in the instant invention.

Johnson (U.S. Pat. No. 3,010,376) shows a method and apparatus for photocomposing wherein a negative holder is moved via a motor driven lead screw, the movement closing when the negative holder touches an electrical contact. Nothing disclosed in this patent relates in any way to placing either one of two lights in predetermined positions.

Ashton (U.S. Pat. No. 2,690,696) and Beattie et al (U.S. Pat. No. 3,290,989) show use of a lead screw to move a table or focus a camera in reproduction apparatus.

U.S. Pat. Nos. 2,460,443 (Benton), 3,611,159 (Florsheim Jr. et al), and 3,640,616 (Eqnaczak et al) show various apparatus in the copying or photographic reproduction field.

SUMMARY OF THE INVENTION

The present invention relates to an apparatus for accurately positioning either of two lights over a vacuum frame in a lithographic process. The invention comprises a housing, in which are mounted a quartz light and a pinpoint light, which is movable along two rails attached to a wall or ceiling above the vacuum frame. The rails are interconnected at each end by crossmembers. An electric motor is supported at one end of the rails, the motor driving a lead screw threadingly connected to the housing and supported by a bearing attached to the opposite crossmember. Limit switches are attached to one of the rails on either side of the housing such that they are actuated when contacted by the housing.

As can be seen, when the motor is turned on, it rotates the lead screw causing the housing to move along the rails. When the housing contacts one of the limit switches, the motor is turned off and the housing is in a position such that one of the lights is in the proper position over the vacuum frame. Movement of the housing in the opposite direction, by rotation of the lead screw in the opposite direction, until it contacts the second limit switch will position the other light over the vacuum table.

The motor is controlled by a remote control box connected to the apparatus by a single electrical cable. This eliminates the electrical hazards of the numerous wires and connections of the prior art devices. The control box has receptacles for connecting a gam control or timer to control the lights, further reducing the number of wires connected directly to the apparatus.

It is an object of the present invention to provide an apparatus that will accurately and rapidly position the desired light over a vacuum frame in a lighographic reproduction process.

It is a further objective to provide such an apparatus which will repeatedly position either of the lights properly with a minimum of time consumption.

Additionally, it is an object of the present invention to position either light over the vacuum frame at the same height so as to minimize gam control or timer setting changes by the operator.

BRIEF DESCRIPTION OF THE DRAWINGS

FIG. 2 is a bottom view of the housing shown in FIG. 1.

FIG. 3 is a schematic diagram of the electrical circuit of the apparatus of FIG. 1.

FIG. 4 is a schematic diagram of the light circuit of the apparatus of FIG. 1.

FIG. 5 is a schematic diagram showing the connection of the photocell to the control box of FIG. 1.

DETAILED DESCRIPTION OF THE PREFERRED EMBODIMENTS

Figure 1:
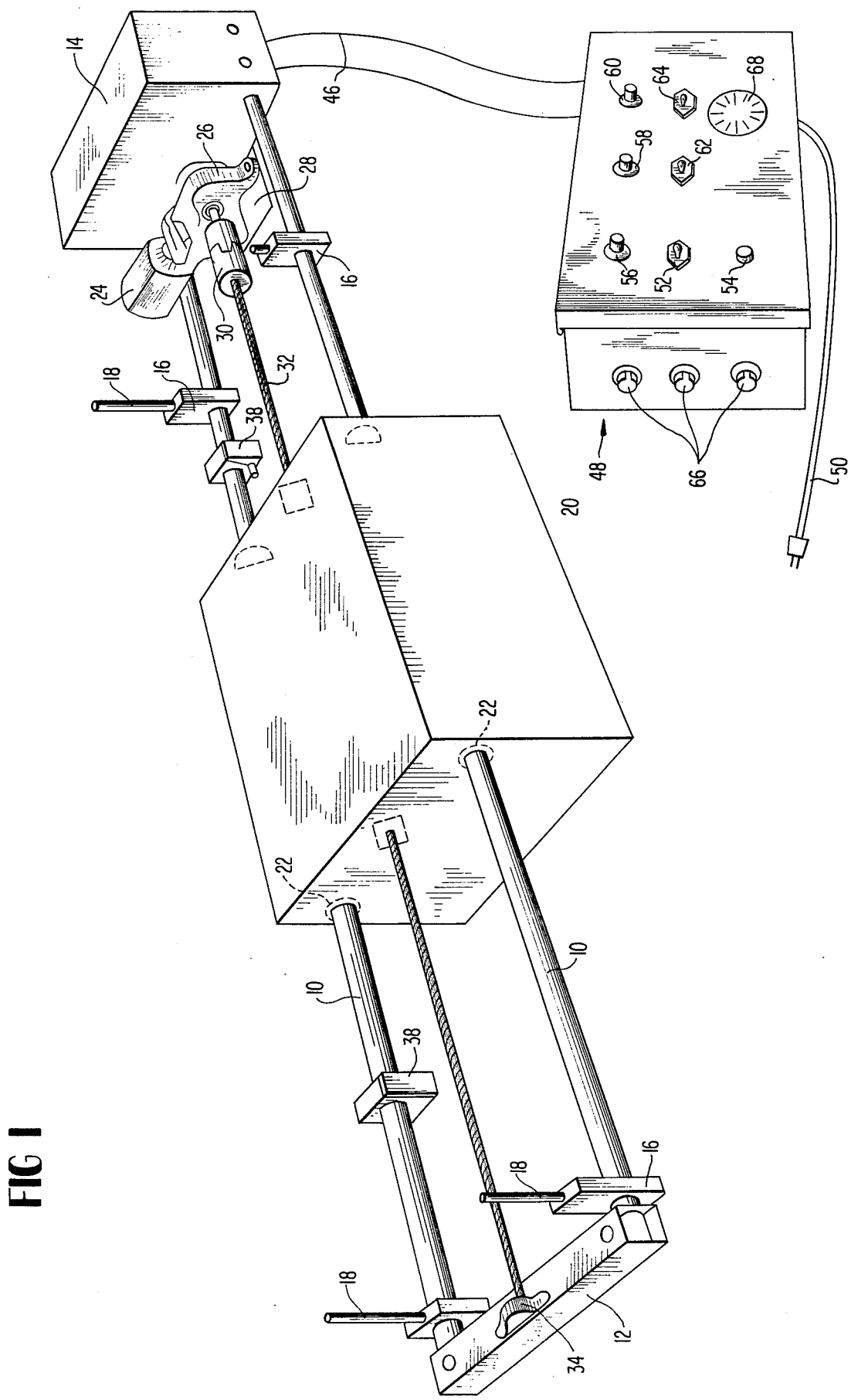
FIG. 1 is a perspective view of the apparatus according to the invention.

The apparatus according to the invention is shown in FIG. 1 and comprises parallel slide rails 10 interconnected by crossmember 12 at one end and by electrical box 14 at the other end. Support brackets 16 are attached of the slide rails 10 and each are connected with support rods 18. Support rods 18 are connected to the ceiling or other structure over a standard vacuum frame. Housing 20 is slidably affixed to the slide rails 10 by way of bearings 22. Motor 24 and gearbox 26 are also attached to the slide rails by bracket 28. Coupling 30 drivingly connects the gearbox output shaft with lead screw 32. Lead screw 32 is supported at its opposite end by pillow block 34 mounted on crossmember 12. Nuts 36 are attached to housing 20 and threadingly engage lead screw 32. Thus, as can be seen, rotation of lead screw 32 causes housing 20 to traverse along slide rails 10, the direction of travel depending upon the direction of rotation of lead screw 32.

Limit switches 38 are attached to one slide rail 10 on either side of housing 20. Limit switches 38 are electrically connected to the control circuit such that when either is contacted by housing 20, motor 24 is shut off, thereby terminating movement of the housing. Both switches may be adjusted along slide rail 10 to accurately adjust the stopping position of housing 20 for each individual installation.

FIG. 2 shows a bottom view of housing 20 with light sockets 40 and 42. Sockets 40 and 42 accept standard, commercially available quartz and pinpoint lights, and are positioned such that at one housing position the quartz light is over the vacuum frame and at the other housing position the pinpoint light is over the vacuum frame. Sockets 40 and 42 are electrically connected to terminal connector 44 which, in turn, is connected to electrical box 14 to supply electrical power to the lights.

Electrical box 14 is also connected to motor 24 and supplies electricity to the motor 24 and the lights via power cable 46 control box 48 and power supply cord 50. Power cable 46 is of sufficient length to enable the control box 48 to be mounted for easy access by the operator. The single power cable 46 eliminates the electrical hazards presented by the multiple connections for the separately mounted lights of the prior art.

Preferably, the face of control box 48 has power on-off switch 52, fuse holder 54, indicator lamps 56, 58, and 60, and pushbutton switches 62 and 64. Power on-off switch 52 controls the main supply of electrical power to the apparatus and indicator lamp 56 is lit when the power is on. Pushbuttons 62 and 64 control the position of housing 20. One button moves the housing to one extreme position while the other button moves the housing to the other extreme position. Indicator lamps 58 and 60 are lit when either pushbutton 62 or 64 is actuated. A typical circuit for the control of the housing movement is shown in FIG. 3.

Control box 48 has external connections 66 for connection to a standard timer control and/or gam control to control the operation of the pinpoint or quartz lights. Gam control is a standard apparatus which integrates time and light density to provide the proper amount of light. Photo cells are provided to sense the light density.

One photo cell is provided on the vacuum table to sense the amount of light put out by the quartz light while a second photo cell is provided in the housing 20 to sense the light emanated by the pinpoint light. If gam control is used, the gam control and each of the photo cells are plugged into the three receptacles 66 shown in FIG. 1. A similar plug for a manually set timer control is provided in the other side of control box 48. The gam control or the manual timer control the operation of the lights after the housing 20 is moved into its desired position. FIGS. 4 and 5 show typical circuits for connecting the quartz and pinpoint lights, and the photo cells to control box 48.

Optionally, a speed control 68 may be provided on control box 48 to control the speed of motor 24 and, subsequently, the speed of movement of housing 20. Any standard means may be provided to achieve the speed control within the scope of the invention.

In operation, the operator places the film to be duplicated and the raw film in the vacuum frame under darkroom conditions. Once the vacuum frame is closed, the operator turns power on-off switch 52 to the on position and pushes either pushbutton 62 or 64 depending upon which light (quartz or pinpoint) is desired. The housing moves to the proper position after which the operator actuates either the gam control or timer to turn on the desired light for the proper time.

What is claimed is:

1. An apparatus for moving a light source into a desired position comprising:
   (a) mounting means for mounting at least two light sources said light sources including at least one pinpoint light and at least one quartz light; and,
   (b) means to move said mounting means into first and second positions such that in a first position one of said light sources is in a desired position, and in a second position, another of said light sources is in a desired position.

2. The apparatus of claim 1 further comprising support means to support said mounting means.

3. The apparatus of claim 2 wherein said mounting means comprises a housing having said at least two light sources mounted therein.

4. The apparatus of claim 3 wherein said support means comprises a pair of parallel rails having said housing slidably mounted thereon.

5. The apparatus of claim 4 wherein said means to move the housing comprises:
   (a) a rotatable lead screw threadingly engaging said housing comprises:
   (b) means to rotate said lead screw such that said housing is moved therealong.

6. The apparatus of claim 5 wherein said means to rotate said lead screw is a reversible electric motor.

7. The apparatus of claim 6 further comprising a limit switch located on each side of said housing and electrically connected to said electric motor such that when either switch is contacted by the housing, said electric motor is shut off.

8. The apparatus of claim 7 wherein the starting of the electric motor and the operation of the light sources are controlled from a control box located remotely from said housing.

9. The apparatus of claim 8 wherein said control box has external connections for a timer and gam control.

10. The apparatus of claim 8 wherein said control box has means for varying the speed at which the housing moves.

11. The apparatus of claim 8 wherein said housing contains only two light sources, one of said sources being a pinpoint light and the other of said sources being a quartz light.

12. Apparatus for positioning either a quartz light or a pinpoint light in proper position over a vacuum frame comprising:
  (a) a pair of support rails mounted in parallel above said vacuum frame;
  (b) a housing slidably attached to said pair of rails, said housing having said quartz light and said pinpoint light mounted therein;
  (c) means to move said housing between a first position in which the quartz light is in operative position over the vacuum frame, and a second position in which the pinpoint light is in operative position over the vacuum frame; and
  (d) remote control means to control the movement of the housing and the operation of the quartz and pinpoint lights.

13. The apparatus of claim 12 wherein said means to move the housing between the first and second positions comprises:
  (a) a lead screw rotatably mounted between said pair of support rails and threadingly attached to said housing;
  (b) a reversible motor connected to said lead screw so as to rotate same; and
  (c) means to shut off said motor when said housing is in the first or the second position.

14. The apparatus of claim 13 wherein said reversible motor is an electric motor.

15. The apparatus of claim 14 wherein said means to shut off the motor comprises a pair of limit switches attached to one of the support rails on either side of said housing and electrically connected to said motor such that when said housing is in the first or second position, it contacts one of the limit switches thereby shutting off said motor.

* * * * *